United States Patent [19]

Pulvari

[11] 4,365,106
[45] * Dec. 21, 1982

[54] EFFICIENT METHOD AND APPARATUS FOR CONVERTING SOLAR ENERGY TO ELECTRICAL ENERGY

[76] Inventor: Charles F. Pulvari, 2014 Taylor St., NE., Washington, D.C. 20018

[*] Notice: The portion of the term of this patent subsequent to Feb. 10, 1998, has been disclaimed.

[21] Appl. No.: 127,171

[22] Filed: Mar. 4, 1980

Related U.S. Application Data

[63] Continuation-in-part of Ser. No. 69,477, Aug. 24, 1979, Pat. No. 4,250,384.

[51] Int. Cl.³ .............................................. H01J 35/00
[52] U.S. Cl. .................................. 136/206; 136/213; 136/254; 322/2 R; 357/30
[58] Field of Search ............... 136/206, 213, 214, 254; 250/330, 338; 307/401; 322/2 R; 357/30

[56] References Cited

U.S. PATENT DOCUMENTS

| | | | |
|---|---|---|---|
| 3,243,687 | 3/1966 | Hoh | 136/213 X |
| 3,256,435 | 7/1966 | Astheimer | 136/213 X |
| 3,769,096 | 10/1973 | Ashkin et al. | 136/213 |
| 4,110,616 | 8/1978 | Porter et al. | 250/332 |
| 4,147,562 | 4/1979 | Chiang et al. | 136/213 |
| 4,250,384 | 2/1981 | Pulvari | 136/206 X |

Primary Examiner—Leland A. Sebastian
Attorney, Agent, or Firm—Jim Zegeer

[57] ABSTRACT

A very thin insulator having a dipole structure such as a dielectric material having ferroelectric, pyroelectric and or thermodielectric properties, is used as the insulator insulating an electrode of an electrode pair from a semiconductor body sandwiched between said electrode pair forming a MIS structure. Radiation and solar energy conversion systems based on establishment of an inversion layer by the thermally released bound charges of a polarizable dielectric layer or an electret and irradation of the semiconductor to separate the electron-hole pairs and subsequent collection of mobile carriers. Since there is no metalurgical junction, the generated carriers are not junction limited therefore the generated voltage could be higher than in an ordinary junction solar cell and could also be, an alternating current voltage which can be transformed or rectified.

15 Claims, 5 Drawing Figures

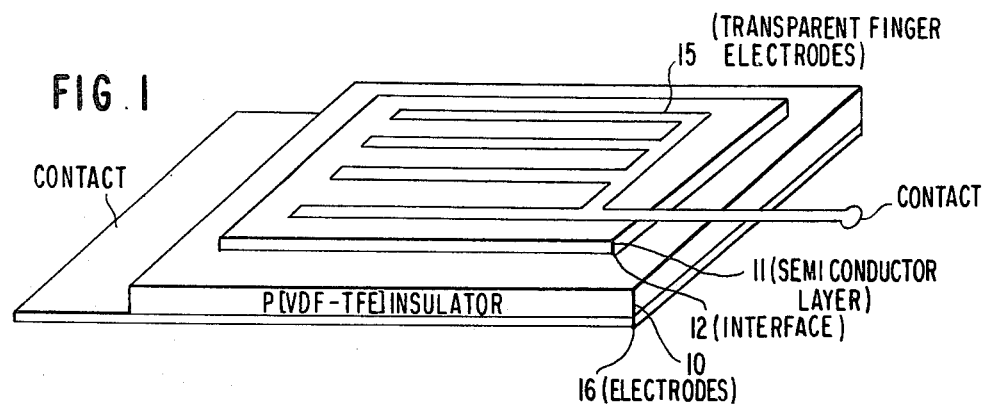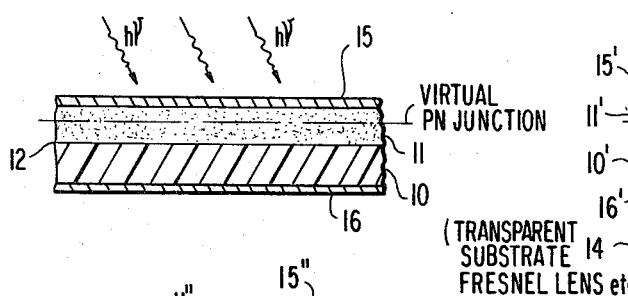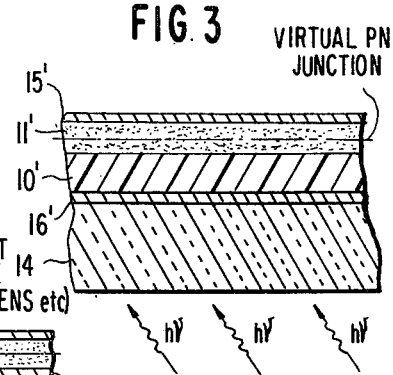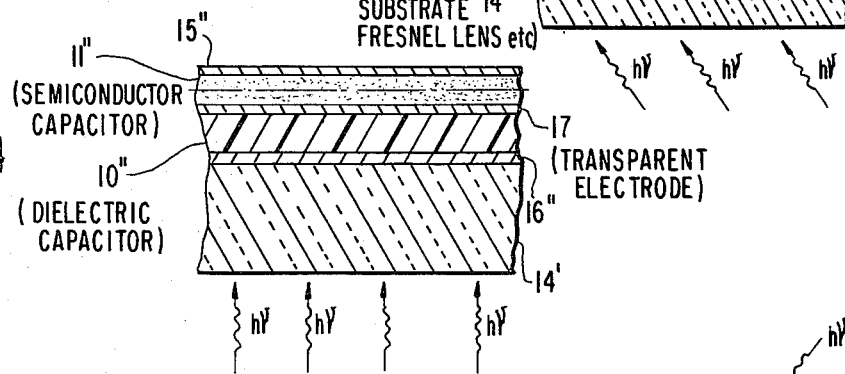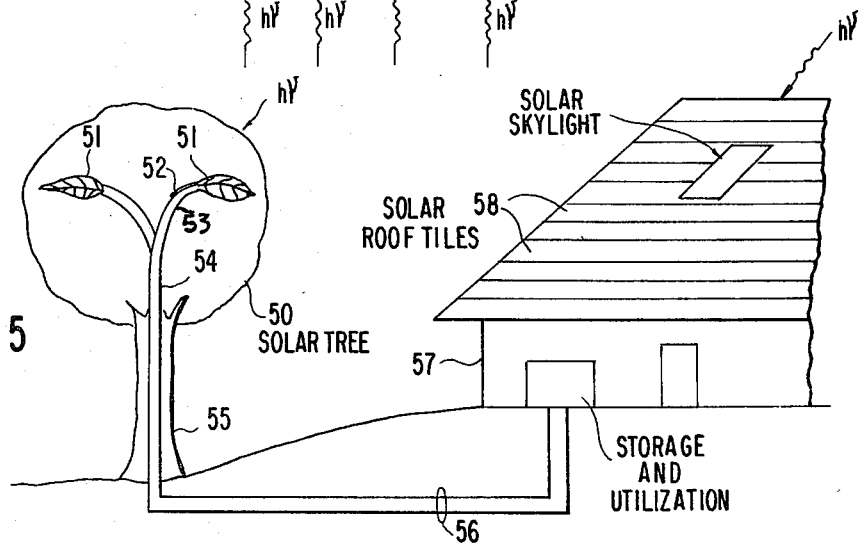

EFFICIENT METHOD AND APPARATUS FOR CONVERTING SOLAR ENERGY TO ELECTRICAL ENERGY

REFERENCE TO RELATED APPLICATION

This application is a continuation-in-part of my application Ser. No. 069,477 filed Aug. 24, 1979 entitled "RADIENT ENERGY SYSTEMS, MEMORIES AND THERMAL IMAGING METHODS AND APPARATUS" now U.S. Pat. No. 4,250,384 issued Feb. 10, 1981.

BACKGROUND OF THE INVENTION

Various forms of solid state solar energy conversion systems are known and used in the art with varying degrees of economy, efficiency and ease of manufactures, there being tradeoffs between each of these desirable goals. One form of energy conversion uses the thermodielectric effect to convert solar radiation to electrical energy, as is disclosed in Hoh U.S. Pat. Nos. 3,073,974 and 3,243,687, incorporated herein by reference. The materials disclosed in the Hoh patents are in the class of ferroelectric energy converters which are very temperature dependent in the neighborhood of the ferroelectric Curie point. The metal-insulator-semiconductor (MIS) art is now well developed and infrared imaging systems using inversion mode operated MIS devices with charge coupled devices (CCD), wherein an inversion region or layer is created at the insulator-semiconductor interface into which photogenerated minority are collected are known, see the article by Andrew J. Steckl et al entitled "Application of Charge Coupled Devices to Infrared Detection and Imaging", published in the IEE publication "Charge Coupled Devices: Technology and Applications" copyrighted in 1977, and incorporated herein by reference.

The objects of the present invention include providing improved radiation and solar energy conversion systems and devices. In achieving these objects, the present invention, in one preferred mode, utilizes a very thin ferroelectric material as the insulator of a MIS device. In another aspect of the invention, a very thin, low heat capacity ferroelectric material having thermodielectric properties is utilized as the insulator in a MIS device. In still another and preferred aspect of the invention solar energy is converted first into thermal and subsequently into electrical energy utilizing a thin ferroelectric layer having pyroelectric properties, the thin ferroelectric layer constituting the insulator in a MIS device, the voltage produced by the pyroelectric conversion in the ferroelectric layer operates to create an inversion region or layer in the semiconductor body and a virtual PN junction. In such state, the utilization of the charge storage and transfer ability of an electroded polarized insulator (e.g. a ferroelectric body member having dipole structure) and semiconductor interface affords the separation of electron whole pairs and the taping of corresponding electrical energy.

The thermally released electrical energy generated by the polarisable dielectric appears on the surface of the dielectric and is used only for causing the necessary bias for producing the inversion layer, which process essentially does not consume much more energy than needed to charge the virtual junction and most of which charge is regained at the end of the cycle.

The above and other objects advantages and features of the invention will become more apparent when considered in conjunction with the accompanying drawings wherein:

FIG. 1 is an isometric view of a solar energy device incorporating the invention.

FIG. 2 is a cross-sectional view of a portion of the devices illustrated in FIG. 1.

FIG. 3 illustrates the modification of the device shown in FIG. 2,

FIG. 4 is a further modification of the invention and,

FIG. 5 illustrates my solar tree and building.

With reference now to FIG. 1 of the drawings radiation or solar energy converter sensing device is shown wherein between two electrodes 15 and 16 a polarised thin insulating layer 10 constituted by a ferroelectric material and a thin semiconductor layer 11, the thin semiconductor layer being deposited, by vapor deposition on the ferroelectric layer to a few microns thick, for example. In the preferred embodiment, ferroelectric layer 10 is a copolymer P(VDF-TFE). In this embodiment, the 90% transparent finger electrode formed as transparent finger electrodes is first formed on a glass substrate (see FIG. 3) followed by insulator 10, semiconductor layer 11 and metal electrode 15.

FIG. 2 shows a cross-section of the radiation i.e. solar (sensing) energy converting device described in FIG. 1. When irradiated, part of the absorbed radiation energy converts into thermal energy elevating the temperature of the whole capacitor structure, comprising the semiconductor layer 11 and polarised insulator (for example a ferroelectric polymer) 10. When a polar dielectric in which a polarization exists is heated or cooled, a change in polarization with temperature occurs and the crystalline or oriented polymer material develops an electric charge on its surface, which in this case appears on the interface IF of the polarised insulator 10 and semiconductor 11. This charge layer generates a sufficient high field and produces an inversion layer in the semiconductor body 11 indicated by 12 and creates a virtual P−N junction similar to the virtual P−N junction occuring in a MIS structure. Since another part of the radiation spectrum generates electron whole pairs in the semiconductor layer 11 these carriers will be separated by the described virtual P−N junction, permitting the photon to electron-whole pair converted electrical energy to appear on the electrodes and to be utilized.

FIG. 3 illustrates a modification wherein one electrode 16' is formed of transparent conductive electrode material, such as doped tin oxide, on a substrate 14, which could be glass or plastic and serves as a fresnel lens to focus light, such as sunlight, on the transparent electrode 16'. Semiconductor layer 11' is transparent to infrared and is formed as a thin layer or film on the dielectric by an epitaxial process. Ferroelectric layer 10' is the MIS insulating layer relative to the second electrode 16'.

This device is not energy gap limited and for solar energy conversion purposes converts a large portion of the spectrum of electromagnetic energy to electrical energy. Since it is an inversion mode operated device there is no physical junction and the epitaxial or polycrystalline layer can be extremely thin and the recombination effect is minimized. It is for this reason that a polycrystalline silicon material can also be efficiently and at much lower cost employed.

It should be noted that the radiation not absorbed by the ferroelectric capacitor will fall on the semiconductor capacitor and produce hole-electron pairs of large abundance because in absence of a physical junction, radiation having larger energies than the impurity energy levels will release, i-e excite (/e/-/h/) electron-hole pairs, and the well caused by the inversion on the MIS interface will collect the mobile cariers. This unique interaction of the ferroelectric in the MIS capacitors results in a highly sensitive and effective radiation conversion over nearly the whole radiation spectrum and considerable higher voltage levels than the conventional photodiode devices. For this reason this biased inversion layer structure converts a larger portion of the radiation spectrum and is less energy gap limited as conventional junction devices are, because nearly 50% of solar energy is in the infrared, which was lost with photodiode type of conversion devices. The proposed improved radiation energy converter utilizes the infra-red portion of the spectrum to heat with it the polarized dielectric and thereby generate a much larger driving potential across the virgual junction than the one available on an ordinary P—N junction which is determined and limited by the difference of the fermi levels in the P and N side of the junction. In this case the driving voltage generated by the polarized dielectric would depend only on the thickness and the strength of polarization of the dielectric and this could be orders of magnitude higher than in P—N junction. The radiation conversion efficiency of this biased inversion layer well solar energy converter is therefore inherently higher than the photodiode type and hence constitutes an improved solar to electrical energy converter.

FIG. 4 is again another modification of the present invention illustrating a combination of the ferroelectric and semiconductor capacitors in such a manner that one of their electrodes is united in a single common electrode 17.

This novel solar to electrical energy converter element can be utilized in a large number of ways for producing more powerful electrical energy generation; in the following only a few examples are presented to illustrate the versatility of this novel device. The building industry could have produced solar tiles, which could be applied on roofs, walls; another such application could be semitransparent windows and sky lights producing electrical energy. Again other novel arrangements and use for this novel device could be a tree, the leaves of which are fabricated of a plastic based small size solar converters from which the electrical energy is collected through the busses in the branches and trunk of the tree, the wind could serve for vibrating these leaves, thereby causing a useful cycling. This avoids the unasthetic and architecturally depressing building structures currently used for collecting solar energy. As shown in FIG. 5 a solar tree 50 having leaves 51 on branches 52 carrying leaf current collecting busses 53 to a trunk buss 54 in trunk 55. There may be several solar trees supplying their electrical energy to an underground line 56 leading to building 57. Building 57 may be roofed with solar tiles 58 having the structure illustrated in FIG. 1 on a supporting ceramic substrate.

It will be appreciated that varous modifications and changes will be obvious to those skilled in the art and such modifications and changes are intended to be encompassed in the spirit of the invention as defined in the claims.

I claim:

1. In a method of converting incident solar energy to electrical energy comprising establishing an inversion layer in a semiconductor body by applying a bias potential to a pair of electrodes one of which is insulated from said semiconductor body, subjecting said inversion layer to one part of the incident solar energy radiation spectrum to generate the electron /e/-hole /h/ pairs, and collecting the mobile carriers, the improvement wherein the bias potential applied to said pair of electrodes is generated in situ by conversion of another portion of incident solar radiation spectrum.

2. The invention defined in claim 1 wherein there is established a plurality (n) of said inversion layers in a common semiconductor body being subjected to a portion of the solar energy being converted to generate the /e/-/h/ pairs in each portion of the semiconductor and commonly collecting said charge carriers from all said charged layers.

3. The invention defined in claim 2 wherein each of said inversion layers is formed by a MOS capacitor at the site of each semiconductor capacitor, generating a bias potential unique to each site by a further solar to electrical energy converter.

4. The invention defined in claim 3 wherein each said further solar to electrical energy converter is constituted by a thermodielectric capacitor element.

5. A double capacitor comprising a pair of electrodes, a thin dielectric layer and a thin semiconductor body sandwiched between said pair of electrodes, said dielectric layer being capable of converting infrared portions of the radiation spectrum to a bias voltage for creating an inversion junction in said thin semiconductor body.

6. A solar to electrical energy converting element comprising a capacitor having a semiconductor body member and at least one pair of electrodes and a second capacitor including a dielectric having a polarizable dipole structure coupled to said semiconductor capacitor in such a way that an inversion layer is in said semiconductor body member, which when irradiated separates the photon (hv) generated /e/-/h/ pairs and collects the mobile carriers in the inversion layer.

7. The solar energy converting sensing element defined in claim 6 wherein said second capacitor has thermodielectric properties.

8. The solar energy converter defined in claim 6 wherein said second capacitor is an electret.

9. Solar to electrical power generator comprising a semiconductor capacitor having a semiconductor body member and at least one pair of electrodes, a solar to electrical energy converter coupled to said semiconductor capacitor in such a way as to constitute a bias voltage source and create an inversion layer in said semiconductor body member such that when said semiconductor body member is irradiated it generates the /e/-/h/ pairs and collects the mobile carriers in said inversion layer and means for extracting the electrical power generated from said pair of electrodes.

10. Solar to electrical power generator as defined in claim 9 wherein said semiconductor capacitor is characterized by a metal oxide semiconductor (MOS) capacitor with said at least one pair of electrodes being biased by said solar to electrical energy converter so as to establish said inversion layer.

11. Solar to electrical power generator as defined in claim 9 wherein one of said electrodes is transparent to solar radiation.

12. Solar to electrical power generator as defined in claim 10 wherein said solar to electrical energy converter is a ferroelectric pyroelectric capacitor interconnected with said MOS capacitor in such a way that when this MOS ferroelectric double capacitor is irradiated with infrared, the pyroelectric generated potential biases said MOS capacitor.

13. Solar to electrical power generator as defined in claim 10 wherein said solar to electrical energy converter includes a ferroelectric thermodielectric capacitor interconnected with said MOS capacitor in such a way that when the MOS-ferroelectric double capacitor thus constituted is irradiated, the thermodielectrically generated potential biases the MOS capacitor to produce said inversion layer.

14. Solar to electrical power generator as defined in claim 13 wherein one of the electrodes on the ferroelectric capacitor is transparent to the radiation to be detected, and consists of two joint electrodes one of which is shared with the MOS capacitor while the other is shared with the ferroelectric capacitor.

15. Solar to electrical power generator as defined in claim 13 wherein one of the electrodes of both the MOS capacitor and the ferroelectric capacitor is transparent to the radiation to be detected.

* * * * *